US012764952B2

(12) United States Patent
Chen et al.

(10) Patent No.: US 12,764,952 B2
(45) Date of Patent: Oct. 13, 2026

(54) LAYOUT STRUCTURE OF MEMORY CELL ARRAY FOR NON-VOLATILE MEMORY

(71) Applicant: eMemory Technology Inc., Hsin-Chu (TW)

(72) Inventors: Chih-Hsin Chen, Hsinchu County (TW); Shih-Chen Wang, Hsinchu County (TW); Bo-Chang Li, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 379 days.

(21) Appl. No.: 18/668,272

(22) Filed: May 20, 2024

(65) Prior Publication Data

US 2024/0422969 A1 Dec. 19, 2024

Related U.S. Application Data

(60) Provisional application No. 63/472,616, filed on Jun. 13, 2023.

(51) Int. Cl.

*H10B 43/10* (2023.01)
*H10B 43/35* (2023.01)

(52) U.S. Cl.

CPC ............. *H10B 43/10* (2023.02); *H10B 43/35* (2023.02)

(58) Field of Classification Search

CPC ................................ H10B 43/10; H10B 41/10
See application file for complete search history.

(56) References Cited

U.S. PATENT DOCUMENTS

| | | | | |
|---|---|---|---|---|
| 9,466,392 | B2 | 10/2016 | Chang et al. | |
| 11,164,880 | B2 | 11/2021 | Lo et al. | |
| 2010/0157669 | A1* | 6/2010 | Audzeyeu | H10B 41/30 365/185.15 |
| 2015/0262666 | A1* | 9/2015 | Taniguchi | G11C 14/0063 365/185.08 |
| 2017/0206970 | A1* | 7/2017 | Lai | G11C 16/0408 |
| 2020/0006508 | A1* | 1/2020 | Lo | G11C 16/0416 |

FOREIGN PATENT DOCUMENTS

KR 20150121449 A * 10/2015 ............ H10W 20/43

* cited by examiner

*Primary Examiner* — Evan G Clinton
(74) *Attorney, Agent, or Firm* — WPAT, PC

(57) ABSTRACT

A layout structure of a memory cell array for a non-volatile memory is provided. The memory cell array includes plural memory cells. Each memory cell includes a capacitor, an erase gate element, a select transistor, a floating gate transistor and a switch transistor. Moreover, plural wells are formed in a semiconductor substrate, and a floating gate is formed over the semiconductor substrate. The locations of the well regions and the shape of the floating gate are specially designed. Moreover, the plural memory cells with at least two shapes are constructed on the semiconductor substrate. Consequently, the layout area of the layout structure of the memory cell array can be effectively reduced.

20 Claims, 9 Drawing Sheets

LAYOUT STRUCTURE OF MEMORY CELL ARRAY FOR NON-VOLATILE MEMORY

This application claims the benefit of U.S. provisional application Ser. No. 63/472,616, filed Jun. 13, 2023, the subject matters of which are incorporated herein by references.

FIELD OF THE INVENTION

The present invention relates to a memory cell of a non-volatile memory, and more particularly to a layout structure of a memory cell array for a non-volatile memory in order to reduce the size of the non-volatile memory.

BACKGROUND OF THE INVENTION

FIG. 1A is a schematic top view illustrating a memory cell of a conventional non-volatile memory. FIG. 1B is a schematic equivalent circuit diagram illustrating the memory cell of the conventional non-volatile memory as shown in FIG. 1A. The memory cell is disclosed in U.S. Pat. No. 11,164,880 B2.

As shown in FIG. 1A, a semiconductor substrate comprises a p-type well region PW, a first n-type well region NW1 and a second n-type well region NW2. The first n-type well region NW1 and the second n-type well region NW2 are formed in two sides of the p-type well region PW. A first gate G1 and a second gate G2 are located over the p-type well region PW. A floating gate FG is located over the p-type well region PW, the first n-type well region NW1 and the second n-type well region NW2. Moreover, each of the floating gate FG, the first gate G1 and the second gate G2 is made of polysilicon.

After a p-type ion implantation process is performed, a first p-type doped region 17 and a second p-type doped region 18 are formed in the second n-type well region NW2. After an n-type ion implantation process is performed, a first n-type doped region 11, a second n-type doped region 12, a third n-type doped region 13 and a fourth n-type doped region 14 are formed in the p-type well region PW.

A conductor line SL (i.e., a source line) is connected with the first n-type doped region 11. A conductor line BL (i.e., a bit line) is connected with the fourth n-type doped region 14. A conductor line EL (i.e., an erase line) is connected with the first p-type doped region 17 and the second p-type doped region 18. A conductor line CL (i.e., a coupling line) is connected with the first n-type well region NW1. A conductor line (e.g., a select line) SGL is connected with the first gate G1. A conductor line WL (i.e., a word line) is connected with the second gate G2.

As shown in FIG. 1A, the floating gate FG is extended to the first n-type well region NW1. Moreover, the floating gate FG and the first n-type well region NW1 are collaboratively formed as a capacitor C1. That is, a first terminal of the capacitor C1 is connected with the floating gate FG, and a second terminal of the capacitor C1 is connected with the coupling line CL.

The floating gate FG is also extended to the second n-type well region NW2. The floating gate FG, the second n-type well region NW2, the first p-type doped region 17 and the second p-type doped region 18 are collaboratively formed as a p-type transistor Mp. That is, the gate terminal of the p-type transistor Mp is connected with the floating gate FG, and the drain terminal and the source terminal of the p-type transistor Mp are connected with the erase line EL. The p-type transistor Mp may be regarded as an erase gate element, and the floating gate FG, the second n-type well region NW2, the first p-type doped region 17 and the second p-type doped region 18 construct an electron ejecting path.

The first n-type doped region 11, the second n-type doped region 12, the third n-type doped region 13 and the fourth n-type doped region 14 are formed in the p-type well region PW. The first gate G1 spans the surface between the first n-type doped region 11 and the second n-type doped region 12. The floating gate FG spans the surface between the second n-type doped region 12 and the third n-type doped region 13. The second gate G2 spans the surface between the third n-type doped region 13 and the fourth n-type doped region 14. In other words, three n-type transistors are constructed in the p-type well region PW. The three n-type transistors include a first n-type transistor Ms, a second n-type transistor Mf and a third n-type transistor Msw.

The first n-type transistor Ms is a select transistor. The gate terminal G1 of the first n-type transistor Ms is connected with the select line SGL. The first n-type doped region 11 is connected with the source line SL. The second n-type doped region 12 is shared by the first n-type transistor Ms and the second n-type transistor Mf.

The second n-type transistor Mf is a floating gate transistor. The gate terminal FG of the second n-type transistor Mf is a floating gate. The third n-type doped region 13 is shared by the second n-type transistor Mf and the third n-type transistor Msw.

The third n-type transistor Msw is a switch transistor. The second gate G2 of the third n-type transistor Msw is connected with the word line WL. The fourth n-type doped region 14 is connected with the bit line BL.

Please refer to the memory cell 100 as shown in FIG. 1B. The gate terminal of the select transistor Ms is connected with the select line SGL. The first source/drain terminal of the select transistor Ms is connected with the source line SL. The first source/drain terminal of the floating gate transistor Mf is connected with the second source/drain terminal of the select transistor Ms. The gate terminal of the switch transistor Msw is connected with the word line WL. The first source/drain terminal of the switch transistor Msw is connected with the second source/drain terminal of the floating gate transistor Mf. The second source/drain terminal of the switch transistor Msw is connected with the bit line BL. The capacitor C1 is connected between the floating gate FG and the coupling line CL. The gate terminal of the p-type transistor Mp is connected with the floating gate FG. The first source/drain terminal and the second source/drain terminal of the p-type transistor Mp are connected with the erase line EL.

Generally, a non-volatile memory comprises a memory cell array, and the memory cell array is composed of plural memory cells. In other words, plural memory cells are constructed on a semiconductor substrate. After the layout structure of the memory cell array is specially designed, the layout area of the non-volatile memory can be effectively reduced.

SUMMARY OF THE INVENTION

An embodiment of the present invention provides a layout structure of a memory cell array for a non-volatile memory. The layout structure includes a first first-type well region, a second first-type region, a first second-type well region, a second second-type well region, a first gate, a second gate, a first floating gate, a first first-type doped region, a second first-type doped region, a third first-type doped region, a fourth first-type doped region, a first second-type doped region, a first contact terminal a second contact terminal. The second first-type well region is arranged between the first second-type well region and the second second-type well region. The first second-type well region is arranged between the first first-type well region and the second first-type well region. The first gate, the second gate and the first floating gate are formed on a surface of the second second-type well region. The first floating gate is extended from the second second-type well region to the first first-type well region through the second first-type well region and the first second-type well region. The first first-type doped region, the second first-type doped region, the third first-type doped region and the fourth first-type doped region are formed in the surface of the second second-type well region. The first gate spans a surface between the first first-type doped region and the second first-type doped region. The first floating gate spans a surface between the second first-type doped region and the third first-type doped region. The second gate spans a surface between the third first-type doped region and the fourth first-type doped region. The first second-type doped region is formed in the first first-type well region. The first second-type doped region is located beside the first floating gate. The first contact terminal is formed on the first second-type doped region and connected with an erase line. The second contact terminal formed on the second first-type well region and connected with a coupling line.

Another embodiment of the present invention provides a layout structure of a memory cell array for a non-volatile memory. The layout structure includes a first first-type well region, a second first-type region, a first second-type well region, a second second-type well region, a third second-type well region, a first gate, a second gate, a first floating gate, a first first-type doped region, a second first-type doped region, a third first-type doped region, a fourth first-type doped region, a first second-type doped region, a first contact terminal and a second contact terminal. The second first-type well region is arranged between the first second-type well region and the second second-type well region. The first second-type well region is arranged between the first first-type well region and the second first-type well region. The first first-type well region is arranged between the first second-type well region and the third second-type well region. The first gate, the second gate and the first floating gate are formed on a surface of the third second-type well region. The first floating gate is extended from the third second-type well region to the second first-type well region through the first first-type well region and the first second-type well region. The first first-type doped region, the second first-type doped region, the third first-type doped region and the fourth first-type doped region are formed in a surface of the third second-type well region. The first gate spans a surface between the first first-type doped region and the second first-type doped region. A first floating gate spans a surface between the second first-type doped region and the third first-type doped region. The second gate spans a surface between the third first-type doped region and the fourth first-type doped region. The first second-type doped region is formed in the first first-type well region. The first second-type doped region is located beside the first floating gate. The first contact terminal is formed on the first second-type doped region and connected with an erase line. The second contact terminal is formed on the second first-type well region and connected with a coupling line.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 2A:
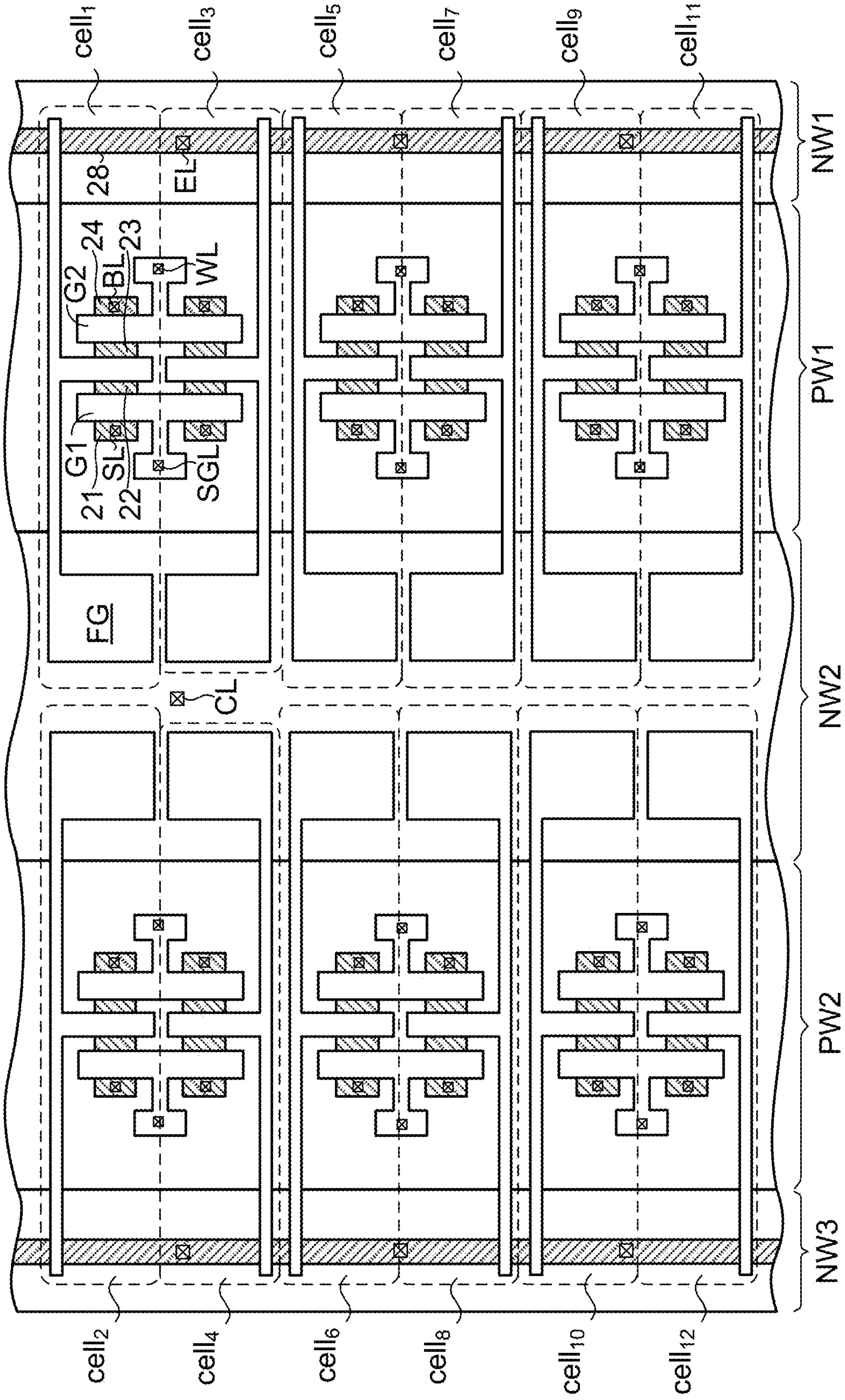
FIGS. 2A and 2B schematically illustrates a layout structure of a memory cell array according to a first embodiment of the present invention.
Figure 2B:
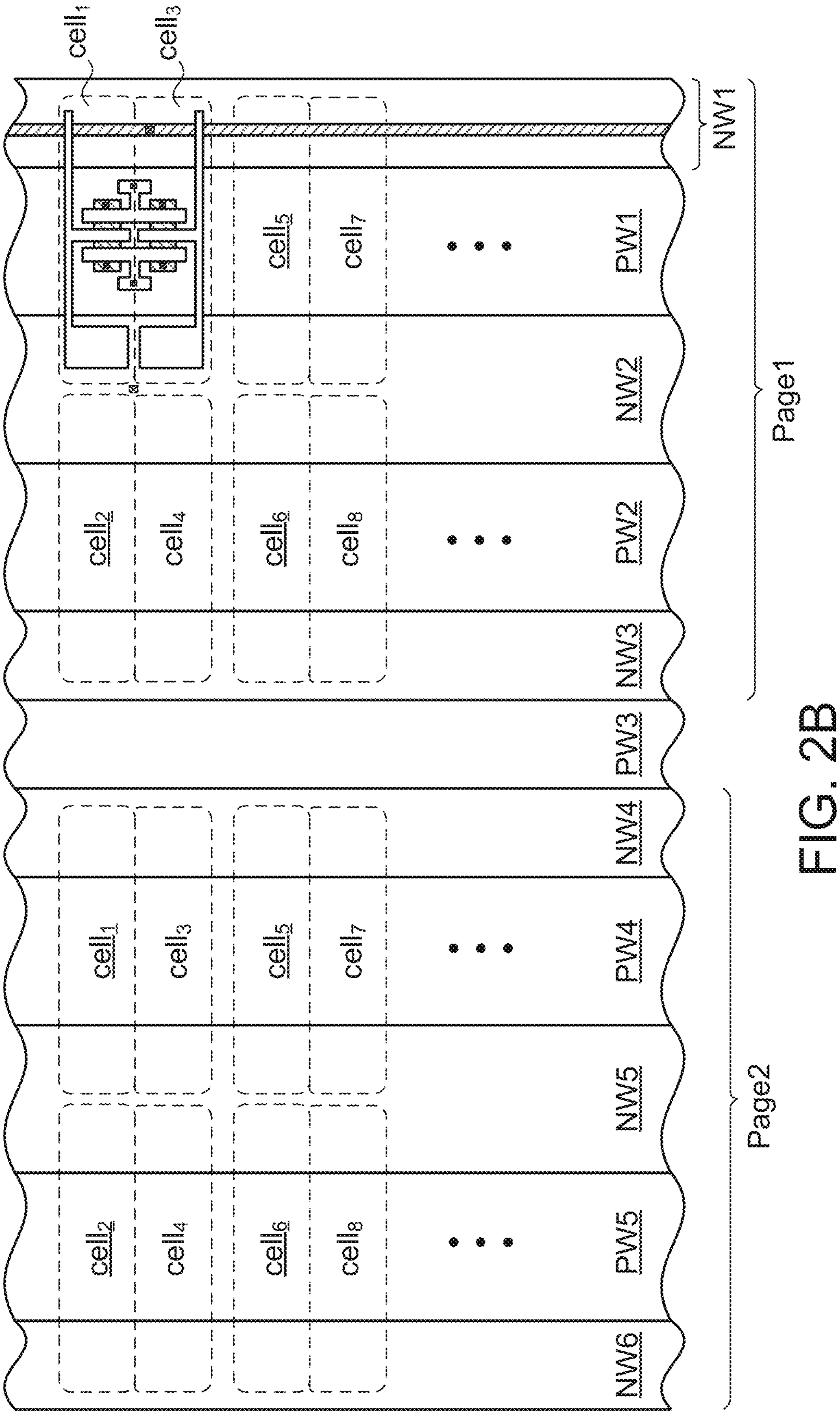

FIGS. 2A and 2B schematically illustrates a layout structure of a memory cell array according to a first embodiment of the present invention.

As shown in FIG. 2A, plural p-type well regions PW1, PW2 and plural n-type well regions NW1, NW2, NM3 are formed under the surface of a semiconductor substrate. The p-type well regions PW1, PW2 and the n-type well regions NW1, NW2, NM3 are arranged alternately. In addition, 12 memory cells $cell_1$~$cell_{12}$ are constructed on the p-type well regions PW1, PW2 and the n-type well regions NW1, NW2, NM3. The odd-numbered memory cells $cell_1$, $cell_3$, $cell_5$, $cell_7$, $cell_9$ and $cell_{11}$ are constructed on the n-type well regions NW1, NW2 and the p-type well region PW1. The even-number memory cells $cell_2$, $cell_4$, $cell_6$, $cell_8$, $cell_{10}$ and $cell_{12}$ are constructed on the n-type well regions NW2, NW3 and the p-type well region PW2. The n-type well region NW2 is shared by all of the memory cells $cell_1$~$cell_{12}$. The structures of the memory cells $cell_1$~$cell_{12}$ are similar. For succinctness, only the structure of the memory cell $cell_1$ will be described as follows.

Please refer to FIG. 2A again. In the memory cell $cell_1$, the n-type well regions NW1 and NW2 are respectively located beside two opposite sides of the p-type well region PW1. A first gate G1 and a second gate G2 are formed over the p-type well region PW1 to cover the p-type well region PW1. In addition, a floating gate FG is formed over the p-type well region PW1 and the n-type well regions NW1, NW2 to cover the p-type well region PW1 and the n-type well regions NW1, NW2. Each of the floating gate FG, the first gate G1 and the second gate G2 comprises a gate dielectric layer and a polysilicon layer. The gate dielectric layer is formed on the surface of the semiconductor substrate. The polysilicon layer is formed over the gate dielectric layer.

Then, a p-type doped region 28 is formed in the n-type well region NW1. In addition, four n-type doped regions 21, 22, 23 and 24 are formed in the p-type well region PW1. A contact terminal is formed on the n-type doped region 21 and connected with a source line SL. A contact terminal is formed on the n-type doped region 24 and connected with a bit line BL. A contact terminal is formed on the p-type doped region 28 and connected with an erase line EL. A contact terminal is formed on the n-type well region NW2 and connected with a coupling line CL. A contact terminal is formed on the first gate G1 and connected with a select line SGL. A contact terminal is formed on the second gate G2 and connected with a word line WL.

As shown in FIG. 2A, the floating gate FG is extended to the n-type well region NW2. In addition, the floating gate FG and the n-type well region NW2 are collaboratively formed as a capacitor. That is, a first terminal of the capacitor is connected with the floating gate FG, and a second terminal of the capacitor is connected with the coupling line CL.

The floating gate FG is also extended to the n-type well region NW1. In addition, the floating gate FG, the n-type well region NW1 and the p-type doped region 28 are collaboratively formed as a p-type transistor. That is, the gate terminal of the p-type transistor is connected with the floating gate FG, and the drain terminal and the source terminal of the p-type transistor are connected with the erase line EL. The p-type transistor may be regarded as an erase gate element, and the floating gate FG, the n-type well region NW1, and the p-type doped region 28 construct an electron ejecting path of ejecting electrons.

The first gate G1 spans the surface between the n-type doped region 21 and the n-type doped region 22. The floating gate FG spans the surface between the n-type doped region 22 and the n-type doped region 23. The second gate G2 spans the surface between the n-type doped region 23 and the n-type doped region 24. In other words, a first n-type transistor, a second n-type transistor and a third n-type transistor are constructed in the p-type well region PW1. The first n-type transistor comprises the first gate G1, the n-type doped region 21 and the n-type doped region 22. The second n-type transistor comprises the floating gate FG, the n-type doped region 22 and the n-type doped region 23. The third n-type transistor comprises the second gate G2, the n-type doped region 23 and the n-type doped region 24.

The first n-type transistor is a select transistor. The first gate G1 of the first n-type transistor is connected with the select line SGL. The n-type doped region 21 is connected with the source line SL.

The second n-type transistor is a floating gate transistor. The gate terminal FG of the second n-type transistor is a floating gate.

The third n-type transistor is a switch transistor. The second gate G2 of the third n-type transistor is connected with the word line WL. The n-type doped region 24 is connected with the bit line BL.

By appropriately connecting the word line WL, the bit line BL, the select line SGL, the coupling line CL and the erase line EL, a memory cell array can be formed. The equivalent circuit of the memory cells $cell_1$ in the first embodiment is similar to the equivalent circuit of the memory cell shown in FIG. 1B, and not redundantly described herein.

The zoom-out layout structure of the memory cell array is shown in FIG. 2B. As shown in FIG. 2B, a non-volatile memory comprises plural pages, and each page comprises plural memory cells. In addition, plural p-type well regions PW1~PW5 and plural n-type well regions NW1~NM6 are alternately arranged and formed under the surface of the semiconductor substrate. The memory cells in the first page Page1 are constructed on the n-type well regions NW1~NM3 and the p-type well regions PW1~PW2. The memory cells in the second page Page2 are constructed on the n-type well regions NW4~NM6 and the p-type well regions PW4~PW5. The p-type well region PW3 is arranged between the n-type well region NW3 of the first page Page1 and the n-type well region NW4 of the second page Page2 and served as a spacing well region.

In the memory cell array of the first embodiment, each page is defined by three n-type well regions and two p-type well regions, and one spacing p-type well region is arranged between every two adjacent pages. Consequently, the layout structure of the memory cell array in the non-volatile memory has a larger layout area.

In some other embodiments, the locations of the well regions and the shape of the floating gate are specially designed. Consequently, the layout area of the layout structure of the memory cell array can be reduced.

Figure 3A:
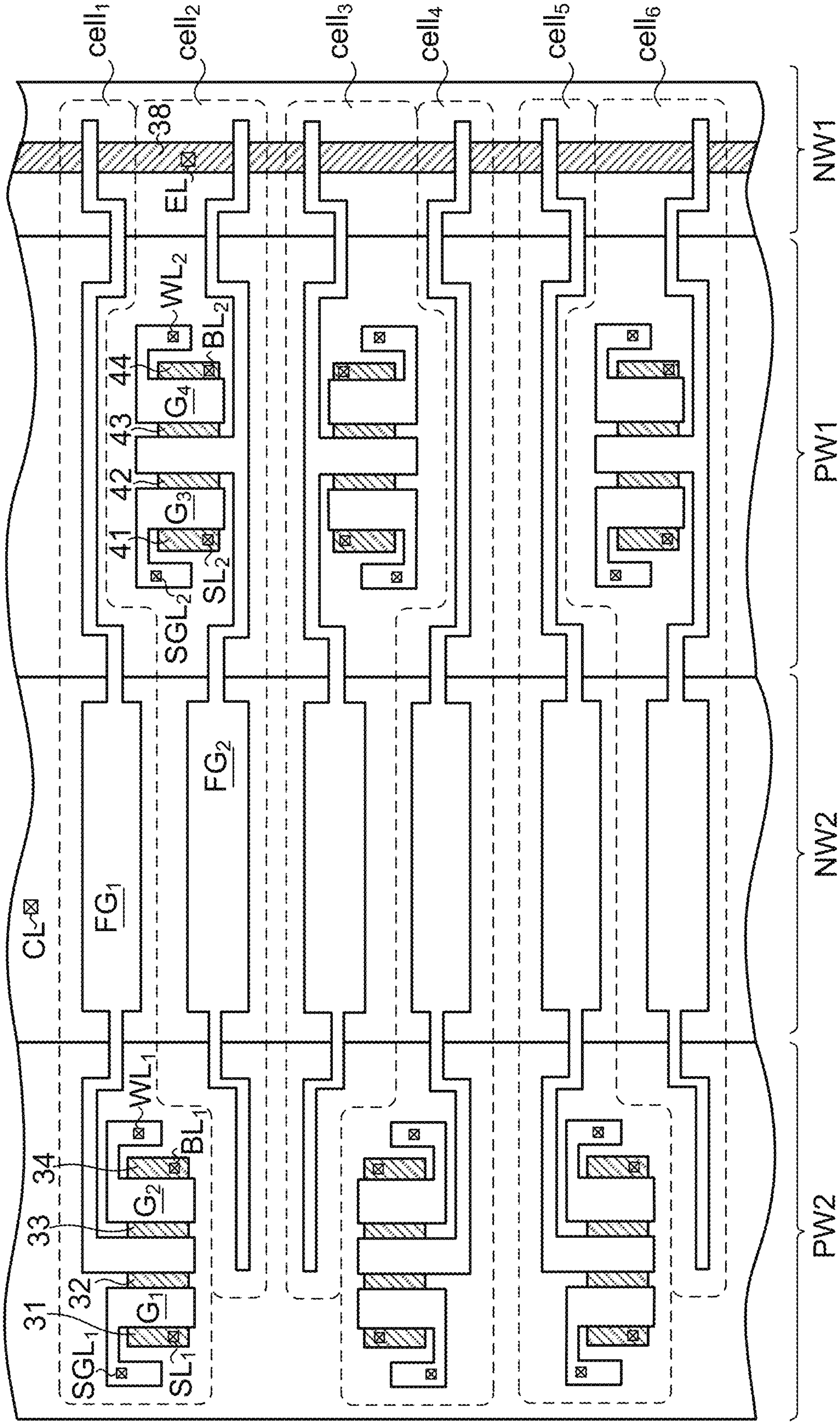
FIGS. 3A and 3B schematically illustrates a layout structure of a memory cell array according to a second embodiment of the present invention.
Figure 3B:
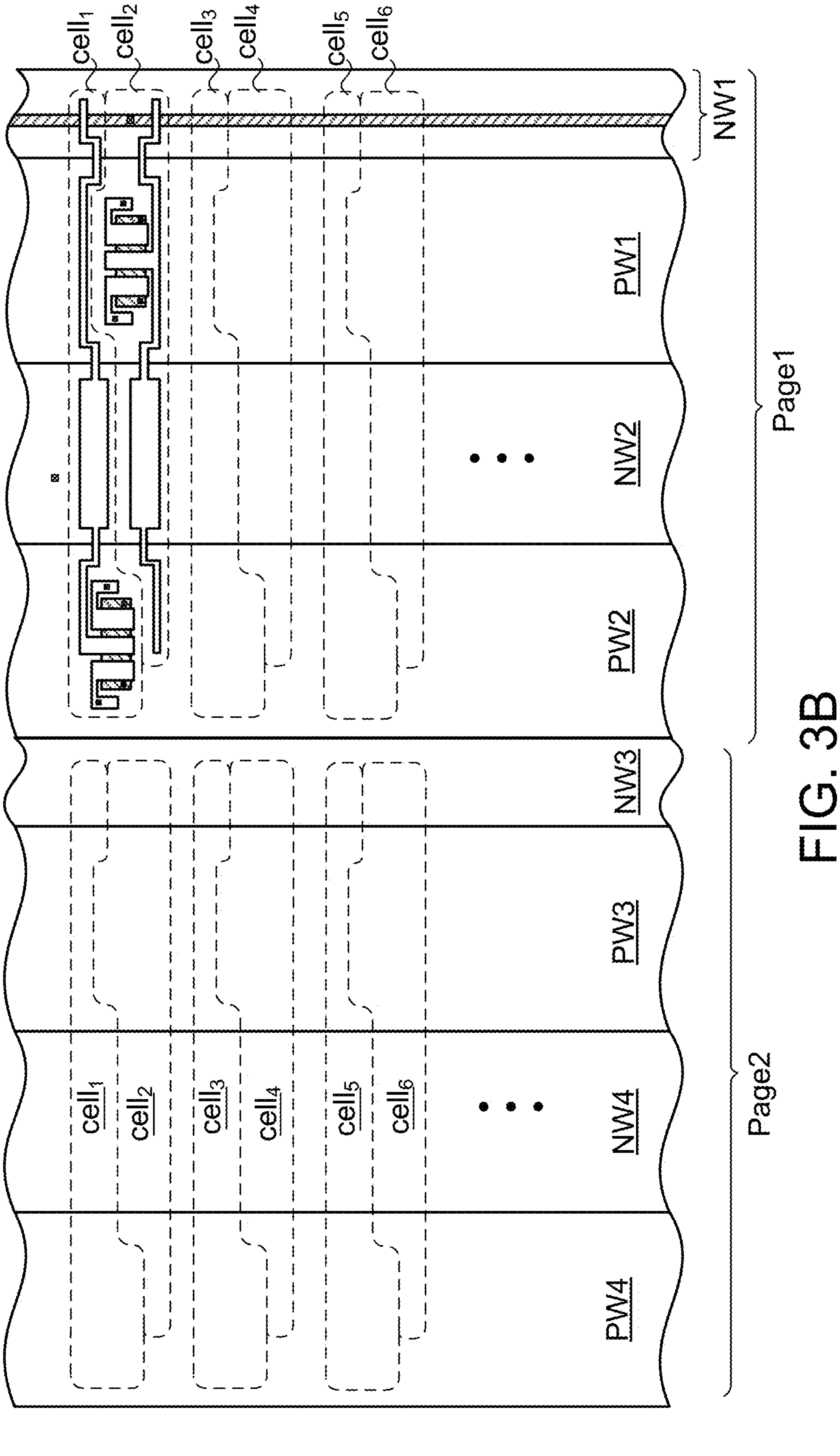

FIGS. 3A and 3B schematically illustrates a layout structure of a memory cell array according to a second embodiment of the present invention. As shown in FIG. 3A, plural p-type well regions PW1, PW2 and plural n-type well regions NW1, NW2 are formed under the surface of a semiconductor substrate. The p-type well regions PW1, PW2 and the n-type well regions NW1, NW2 are arranged alternately. The n-type well region NW2 is arranged between the p-type well regions PW1 and PW2. The p-type well region PW1 is arranged between the n-type well regions NW1 and NW2. In addition, 6 memory cells $cell_1$~$cell_6$ are constructed on the p-type well regions PW1, PW2 and the n-type well regions NW1, NW2. The structures of the memory cells $cell_1$, $cell_4$ and $cell_5$ are similar, and the structures of the memory cells $cell_2$, $cell_3$ and $cell_6$ are similar. For succinctness, only the structure of the memory cell $cell_1$ and the structure of the memory cell $cell_2$ will be described as follows.

Please refer to FIG. 3A again. In the memory cell $cell_1$, a first gate G1 and a second gate G2 are formed over the p-type well region PW2 to cover the p-type well region PW2. In addition, a first floating gate $FG_1$ is formed over the p-type well regions PW1, PW2 and the n-type well regions NW1, NW2 to cover the p-type well regions PW1, PW2 and the n-type well regions NW1, NW2.

In the memory cell $cell_2$, a third gate $G_3$ and a fourth gate $G_4$ are formed over the p-type well region PW1 to cover the p-type well region PW1. In addition, a second floating gate $FG_2$ is formed over the p-type well regions PW1, PW2 and the n-type well regions NW1, NW2 to cover the p-type well regions PW1, PW2 and the n-type well regions NW1, NW2. Each of the first floating gate $FG_1$, the second floating gate $FG_2$, the first gate $G_1$, the second gate $G_2$, the third gate $G_3$ and the fourth gate $G_4$ comprises a gate dielectric layer and a polysilicon layer. The gate dielectric layer is formed on the surface of the semiconductor substrate. The polysilicon layer is formed over the gate dielectric layer.

Then, a p-type doped region 38 is formed in the n-type well region NW1. In addition, four n-type doped regions 31, 32, 33 and 34 are formed in the p-type well region PW2, and four n-type doped regions 41, 42, 43 and 44 are formed in the p-type well region PW1. A contact terminal is formed on the n-type doped region 31 and connected with a source line $SL_1$. A contact terminal is formed on the n-type doped region 34 and connected with a bit line $BL_1$. A contact terminal is formed on the n-type doped region 41 and connected with a source line $SL_2$. A contact terminal is formed on the n-type doped region 44 and connected with a bit line $BL_2$. A contact terminal is formed on the p-type doped region 38 and connected with an erase line EL. A contact terminal is formed on the n-type well region NW2 and connected with a coupling line CL. A contact terminal is formed on the first gate $G_1$ and connected with a select line $SGL_1$. A contact terminal is formed on the second gate $G_2$ and connected with a word line $WL_1$. A contact terminal is formed on the third gate $G_3$ and connected with a select line $SGL_2$. A contact terminal is formed on the fourth gate $G_4$ and connected with a word line $WL_2$.

As shown in FIG. 3A, the first floating gate $FG_1$ is extended from the p-type well region PW2 to the n-type well region NW1 through the n-type well region NW2 and the p-type well region PW1. In addition, the first floating gate $FG_1$ and the n-type well region NW2 are collaboratively formed as a capacitor. That is, a first terminal of the capacitor is connected with the first floating gate $FG_1$, and a second terminal of the capacitor is connected with the coupling line CL. The first floating gate $FG_1$ is also extended to the n-type well region NW1 and located beside the p-type doped region 38. In addition, the first floating gate $FG_1$, the n-type well region NW1 and the p-type doped region 38 are collaboratively formed as a p-type transistor. That is, the gate terminal of the p-type transistor is connected with the first floating gate $FG_1$, and the drain terminal and the source terminal of the p-type transistor are connected with the erase line EL. The p-type transistor may be regarded as an erase gate element, and the first floating gate $FG_1$, the n-type well region NW1 and the p-type doped region 38 construct an electron ejecting path of the memory cell $Cell_1$. That is, the electrons of the memory cell $Cell_1$ can be ejected from the first floating gate $FG_1$ to the erase line EL.

The second floating gate $FG_2$ comprises two branches. The first branch of the second floating gate $FG_2$ is extended from the p-type well region PW1 to the n-type well region NW2 and the p-type well region PW2. The second branch of the second floating gate $FG_2$ is extended from the p-type well region PW1 to the n-type well region NW1. In addition, the second branch of the second floating gate $FG_2$ is located beside the p-type doped region 38. The second floating gate $FG_2$ and the n-type well region NW2 are collaboratively formed as a capacitor. That is, a first terminal of the capacitor is connected with the second floating gate $FG_2$, and a second terminal of the capacitor is connected with the coupling line CL. Moreover, the second floating gate $FG_2$, the n-type well region NW1 and the p-type doped region 38 are collaboratively formed as a p-type transistor. That is, the gate terminal of the p-type transistor is connected with the second floating gate $FG_2$, and the drain terminal and the source terminal of the p-type transistor are connected with the erase line EL. The second floating gate $FG_2$, the n-type well region NW1, and the p-type doped region 38 construct an electron ejecting path of the memory cell $Cell_2$. That is, the electrons of the memory cell $Cell_2$ can be ejected from the second floating gate $FG_2$ to the erase line EL.

In the memory cell $Cell_1$, the first gate $G_1$ spans the surface between the n-type doped region 31 and the n-type doped region 32. The first floating gate $FG_1$ spans the surface between the n-type doped region 32 and the n-type doped region 33. The second gate $G_2$ spans the surface between the n-type doped region 33 and the n-type doped region 34. In other words, a first n-type transistor, a second n-type transistor and a third n-type transistor are constructed in the p-type well region PW2. The first n-type transistor comprises the first gate $G_1$, the n-type doped region 31 and the n-type doped region 32. The second n-type transistor comprises the first floating gate $FG_1$, the n-type doped region 32 and the n-type doped region 33. The third n-type transistor comprises the second gate $G_2$, the n-type doped region 33 and the n-type doped region 34.

The first n-type transistor is a select transistor. The first gate $G_1$ of the first n-type transistor is connected with the select line $SGL_1$. The n-type doped region 31 is connected with the source line $SL_1$. The second n-type transistor is a floating gate transistor. The third n-type transistor is a switch transistor. The second gate $G_2$ of the third n-type transistor is connected with the word line $WL_1$. The n-type doped region 34 is connected with the bit line $BL_1$.

In the memory cell $Cell_2$, the third gate $G_3$ spans the surface between the n-type doped region 41 and the n-type doped region 42. The second floating gate $FG_2$ spans the surface between the n-type doped region 42 and the n-type doped region 43. The fourth gate $G_4$ spans the surface between the n-type doped region 43 and the n-type doped region 44. In other words, a fourth n-type transistor, a fifth n-type transistor and a sixth n-type transistor are constructed in the p-type well region PW1. The fourth n-type transistor comprises the third gate $G_3$, the n-type doped region 41 and the n-type doped region 42. The fifth n-type transistor comprises the second floating gate $FG_2$, the n-type doped region 42 and the n-type doped region 43. The sixth n-type transistor comprises the fourth gate $G_4$, the n-type doped region 43 and the n-type doped region 44.

The fourth n-type transistor is a select transistor. The third gate $G_3$ of the fourth n-type transistor is connected with the select line $SGL_2$. The n-type doped region 41 is connected with the source line $SL_2$. The fifth n-type transistor is a floating gate transistor. The sixth n-type transistor is a switch transistor. The fourth gate $G_4$ of the sixth n-type transistor is connected with the word line $WL_2$. The n-type doped region 44 is connected with the bit line $BL_2$.

By appropriately connecting the word lines $WL_1$, $WL_2$, the bit lines $BL_1$, $BL_2$, the select lines $SGL_1$, $SGL_2$, the coupling line CL and the erase line EL, a memory cell array can be formed.

Figure 1B:
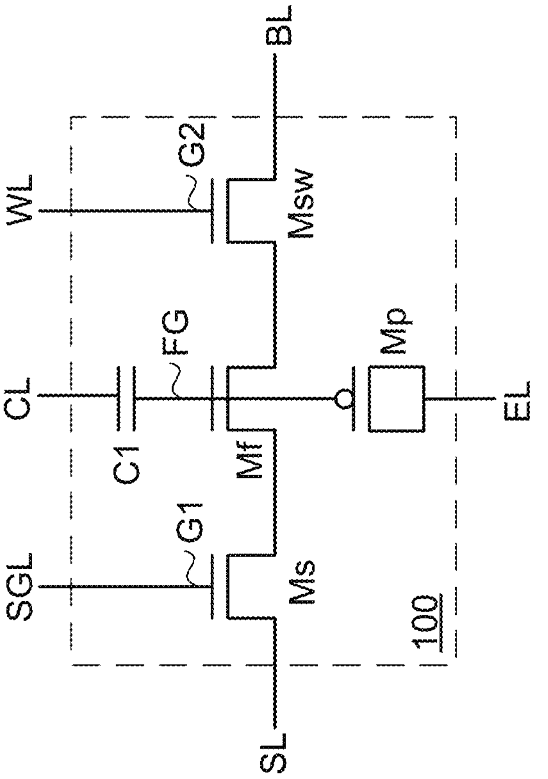
FIG. 1B (PRIOR ART)
FIG. 1B (prior art) is a schematic equivalent circuit diagram illustrating the memory cell of the conventional non-volatile memory as shown in FIG. 1A.
Figure 1A:
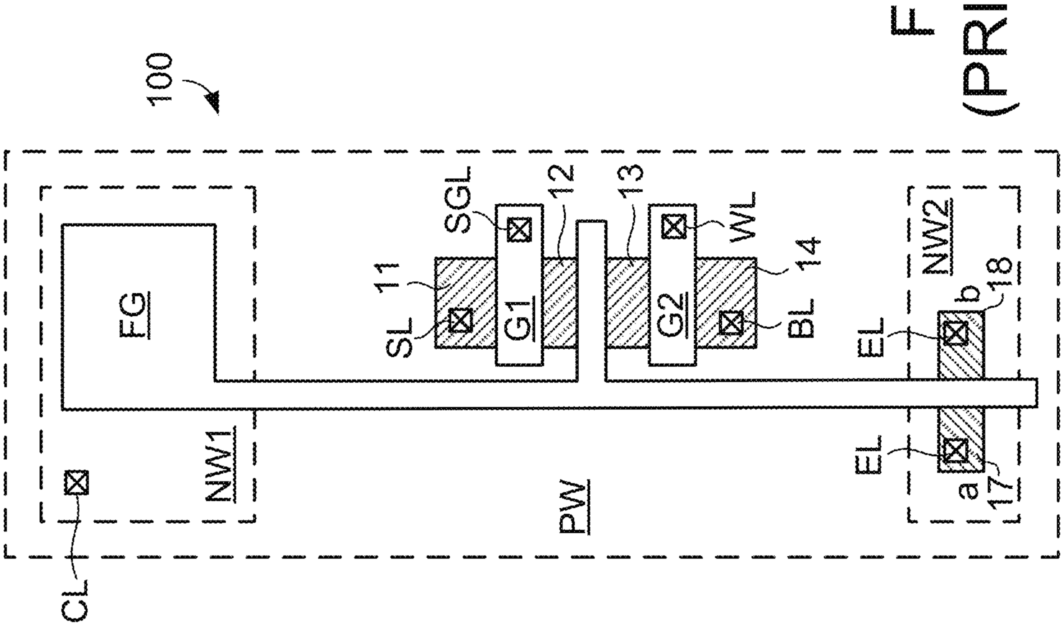
FIG. 1A (PRIOR ART)
FIG. 1A (prior art) is a schematic top view illustrating a memory cell of a conventional non-volatile memory.

The equivalent circuit of each of the memory cells $Cell_1$ and the memory cell $Cell_2$ in the second embodiment is similar to the equivalent circuit of the memory cell shown in FIG. 1B, and not redundantly described herein.

The zoom-out layout structure of the memory cell array is shown in FIG. 3B. As shown in FIG. 3B, a non-volatile memory comprises plural pages, and each page comprises plural memory cells. In addition, plural p-type well regions PW1~PW4 and plural n-type well regions NW1~NM4 are alternately arranged and formed under the surface of the semiconductor substrate. The memory cells in the first page Page1 are constructed on the n-type well regions NW1, NM2 and the p-type well regions PW1, PW2. The memory cells in the second page Page2 are constructed on the n-type well regions NW3, NM4 and the p-type well regions PW3, PW4.

In comparison with the layout structure of the memory cell array of the first embodiment, each page in the layout structure of the memory cell array of the second embodiment is defined by two n-type well regions and two p-type well regions. Moreover, there is no spacing well between every two adjacent pages. Consequently, the layout structure of the memory cell array of the second embodiment has the smaller layout area.

Figure 4A:
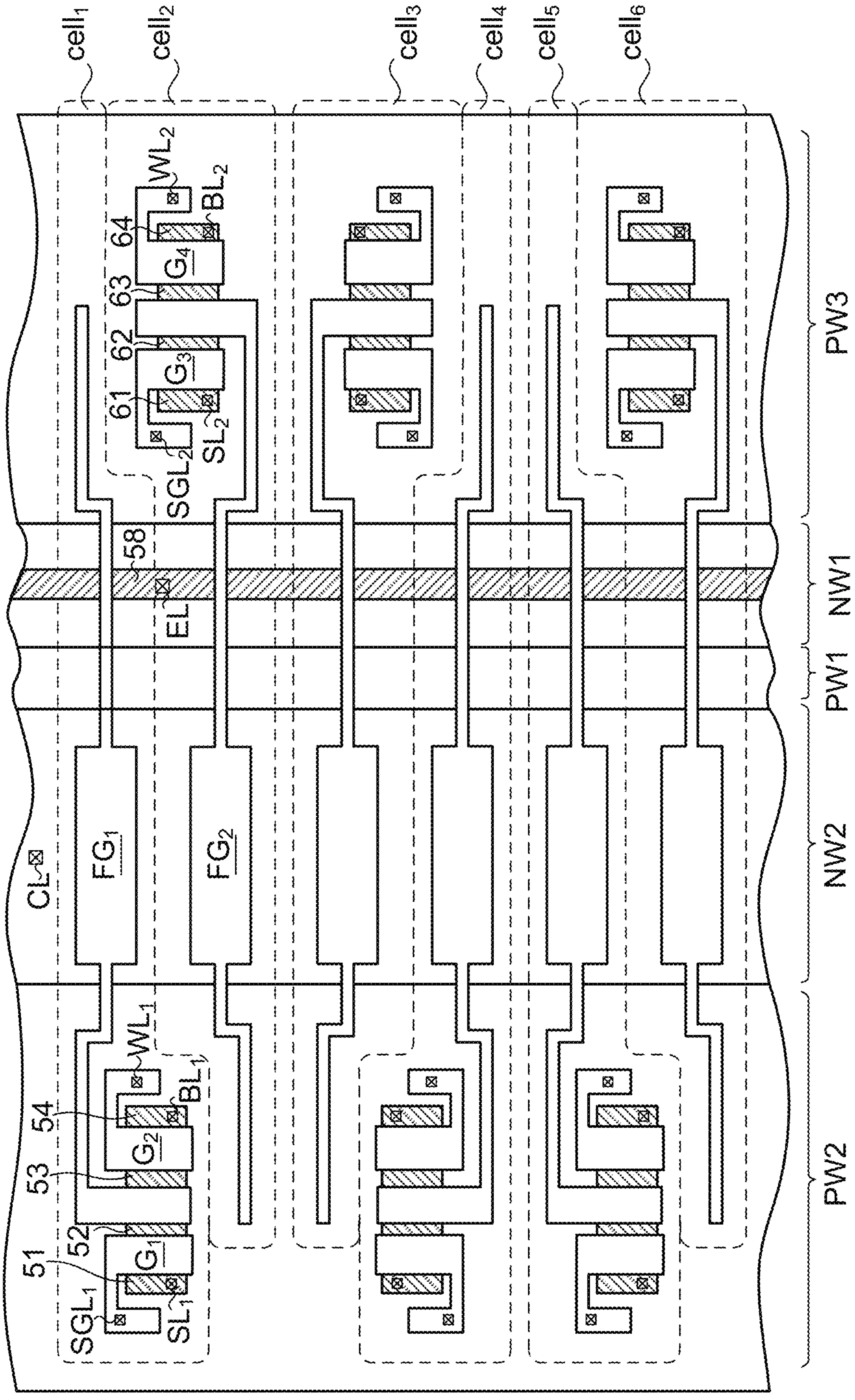
FIGS. 4A and 4B schematically illustrates a layout structure of a memory cell array according to a third embodiment of the present invention.
Figure 4B:
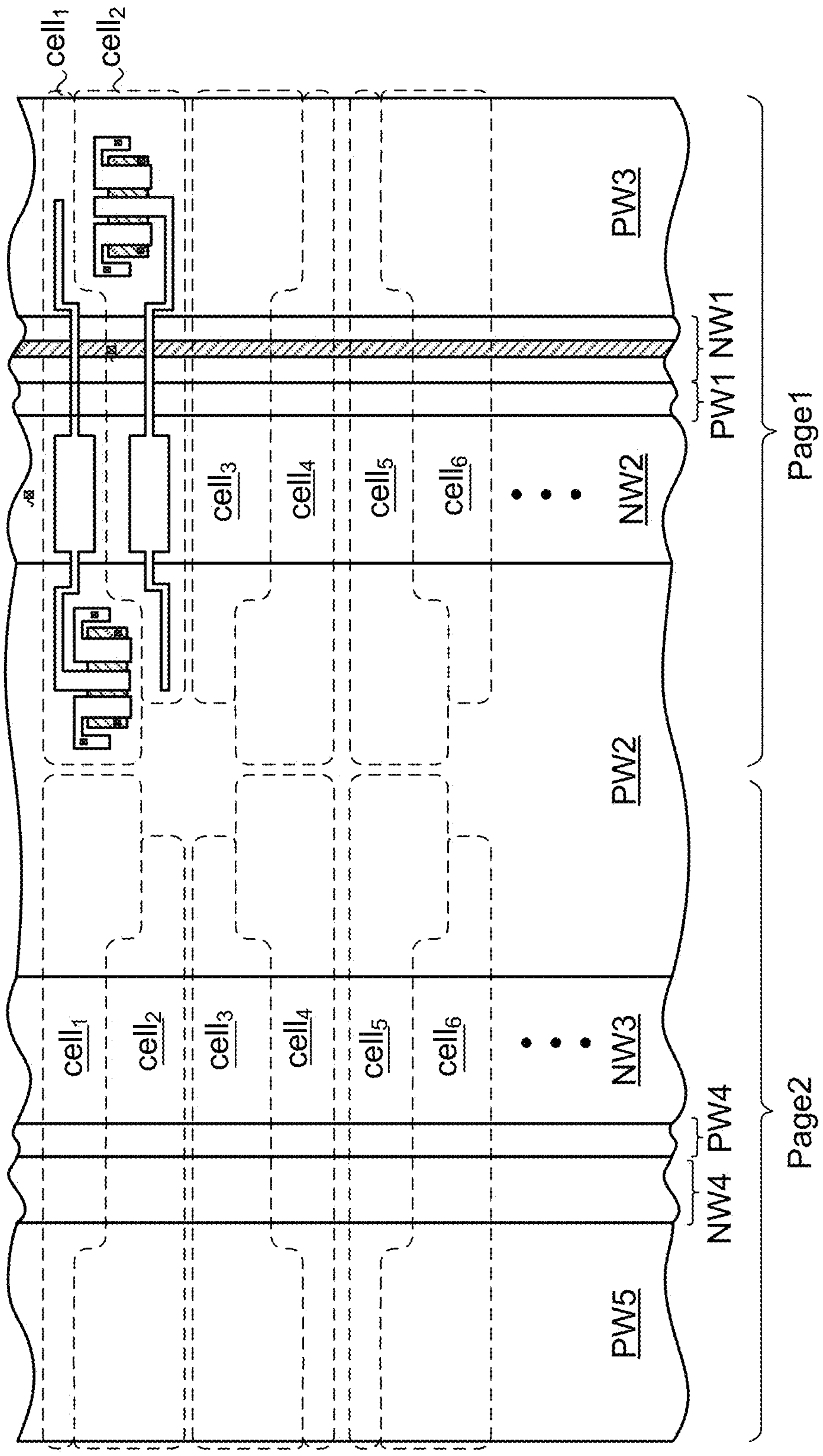

FIGS. 4A and 4B schematically illustrates a layout structure of a memory cell array according to a third embodiment of the present invention. As shown in FIG. 4A, plural p-type well regions PW1, PW2, PW3 and plural n-type well regions NW1, NW2 are formed under the surface of a semiconductor substrate. The p-type well regions PW1, PW2, PW3 and the n-type well regions NW1, NW2 are arranged alternately. The n-type well region NW2 is arranged between the p-type well regions PW1 and PW2. The p-type well region PW1 is arranged between the n-type well regions NW1 and NW2. The n-type well region NW1 is arranged between the p-type well regions PW1 and PW3. In addition, 6 memory cells $cell_1$~$cell_6$ are constructed on the p-type well regions PW1, PW2, PW3 and the n-type well regions NW1, NW2. The structures of the memory cells $cell_1$, $cell_4$ and cells are similar, and the structures of the memory cells $cell_2$, $cell_3$ and cells are similar. For succinctness, only the structure of the memory cell $cell_1$ and the structure of the memory cell $cell_2$ will be described as follows.

Please refer to FIG. 4A again. In the memory cell $cell_1$, a first gate $G_1$ and a second gate $G_2$ are formed over the p-type well region PW2 to cover the p-type well region PW2. In addition, a first floating gate $FG_1$ is formed over the p-type well regions PW1, PW2, PW3 and the n-type well regions NW1, NW2 to cover the p-type well regions PW1, PW2, PW3 and the n-type well regions NW1, NW2.

In the memory cell $cell_2$, a third gate $G_3$ and a fourth gate $G_4$ are formed over the p-type well region PW3 to cover the p-type well region PW3. In addition, a second floating gate $FG_2$ is formed over the p-type well regions PW1, PW2, PW3 and the n-type well regions NW1, NW2 to cover the p-type well regions PW1, PW2, PW3 and the n-type well regions NW1, NW2. Each of the first floating gate $FG_1$, the second floating gate $FG_2$, the first gate $G_1$, the second gate $G_2$, the third gate $G_3$ and the fourth gate $G_4$ comprises a gate dielectric layer and a polysilicon layer. The gate dielectric layer is formed on the surface of the semiconductor substrate. The polysilicon layer is formed over the gate dielectric layer.

Then, a p-type doped region 58 is formed in the n-type well region NW1. In addition, four n-type doped regions 51, 52, 53 and 54 are formed in the p-type well region PW2, and four n-type doped regions 61, 62, 63 and 64 are formed in the p-type well region PW3. A contact terminal is formed on the n-type doped region 51 and connected with a source line $SL_1$. A contact terminal is formed on the n-type doped region 54 and connected with a bit line $BL_1$. A contact terminal is formed on the n-type doped region 61 and connected with a source line $SL_2$. A contact terminal is formed on the n-type doped region 64 and connected with a bit line $BL_2$. A contact terminal is formed on the p-type doped region 58 and connected with an erase line EL. A contact terminal is formed on the n-type well region NW2 and connected with a coupling line CL. A contact terminal is formed on the first gate $G_1$ and connected with a select line $SGL_1$. A contact terminal is formed on the second gate $G_2$ and connected with a word line $WL_1$. A contact terminal is formed on the third gate $G_3$ and connected with a select line $SGL_2$. A contact terminal is formed on the fourth gate $G_4$ and connected with a word line $WL_2$.

As shown in FIG. 4A, the first floating gate $FG_1$ is extended from the p-type well region PW2 to the p-type well region PW3 through the n-type well region NW2, the p-type well region PW1 and the n-type well region NW1. In addition, the first floating gate $FG_1$ and the n-type well region NW2 are collaboratively formed as a capacitor. That is, a first terminal of the capacitor is connected with the first floating gate $FG_1$, and a second terminal of the capacitor is connected with the coupling line CL. The first floating gate $FG_1$ is also extended to the n-type well region NW1 and located beside the p-type doped region 58. In addition, the first floating gate $FG_1$, the n-type well region NW1 and the p-type doped region 58 are collaboratively formed as a p-type transistor. That is, the gate terminal of the p-type transistor is connected with the first floating gate $FG_1$, and the drain terminal and the source terminal of the p-type transistor are connected with the erase line EL. The p-type transistor may be regarded as an erase gate element, and the first floating gate $FG_1$, the n-type well region NW1 and the p-type doped region 58 construct an electron ejecting path of the memory cell $Cell_1$. That is, the electrons of the memory cell $Cell_1$ can be ejected from the first floating gate $FG_1$ to the erase line EL.

The second floating gate $FG_2$ is extended from the p-type well region PW3 to the p-type well region PW2 through the n-type well region NW1, the p-type well region PW1 and the n-type well region NW2. The second floating gate $FG_2$ and the n-type well region NW2 are collaboratively formed as a capacitor. That is, a first terminal of the capacitor is connected with the second floating gate $FG_2$, and a second terminal of the capacitor is connected with the coupling line CL. In addition, the second floating gate $FG_2$ is located beside the p-type doped region 58. Moreover, the second floating gate $FG_2$, the n-type well region NW1 and the p-type doped region 58 are collaboratively formed as a p-type transistor. That is, the gate terminal of the p-type transistor is connected with the second floating gate $FG_2$, and the drain terminal and the source terminal of the p-type transistor are connected with the erase line EL. The second floating gate $FG_2$, the n-type well region NW1, and the p-type doped region 58 construct an electron ejecting path of the memory cell $Cell_2$. That is, the electrons of the memory cell $Cell_2$ can be ejected from the second floating gate $FG_2$ to the erase line EL.

In the memory cell $Cell_1$, the first gate $G_1$ spans the surface between the n-type doped region 51 and the n-type doped region 52. The first floating gate $FG_1$ spans the surface between the n-type doped region 52 and the n-type doped region 53. The second gate $G_2$ spans the surface between the n-type doped region 53 and the n-type doped region 54. In other words, a first n-type transistor, a second n-type transistor and a third n-type transistor are constructed in the p-type well region PW2. The first n-type transistor comprises the first gate $G_1$, the n-type doped region 51 and the n-type doped region 52. The second n-type transistor comprises the first floating gate $FG_1$, the n-type doped region 52 and the n-type doped region 53. The third n-type transistor comprises the second gate $G_2$, the n-type doped region 53 and the n-type doped region 54.

The first n-type transistor is a select transistor. The first gate $G_1$ of the first n-type transistor is connected with the select line $SGL_1$. The n-type doped region 51 is connected with the source line $SL_1$. The second n-type transistor is a floating gate transistor. The third n-type transistor is a switch transistor. The second gate $G_2$ of the third n-type transistor is connected with the word line $WL_1$. The n-type doped region 54 is connected with the bit line $BL_1$.

In the memory cell $Cell_2$, the third gate Gs spans the surface between the n-type doped region 61 and the n-type doped region 62. The second floating gate $FG_2$ spans the surface between the n-type doped region 62 and the n-type doped region 63. The fourth gate $G_4$ spans the surface between the n-type doped region 63 and the n-type doped region 64. In other words, a fourth n-type transistor, a fifth n-type transistor and a sixth n-type transistor are constructed in the p-type well region PW3. The fourth n-type transistor comprises the third gate $G_3$, the n-type doped region 61 and the n-type doped region 62. The fifth n-type transistor comprises the second floating gate $FG_2$, the n-type doped region 62 and the n-type doped region 63. The sixth n-type transistor comprises the fourth gate $G_4$, the n-type doped region 63 and the n-type doped region 64.

The fourth n-type transistor is a select transistor. The third gate $G_3$ of the fourth n-type transistor is connected with the select line $SGL_2$. The n-type doped region 61 is connected with the source line $SL_2$. The fifth n-type transistor is a floating gate transistor. The sixth n-type transistor is a switch transistor. The fourth gate $G_4$ of the sixth n-type transistor is connected with the word line $WL_2$. The n-type doped region 64 is connected with the bit line $BL_2$.

By appropriately connecting the word lines $WL_1$, $WL_2$, the bit lines $BL_1$, $BL_2$, the select lines $SGL_1$, $SGL_2$, the coupling line CL and the erase line EL, a memory cell array can be formed.

The equivalent circuit of each of the memory cell $Cell_1$ and the memory cell $Cell_2$ in the third embodiment is similar to the equivalent circuit of the memory cell shown in FIG. 1B, and not redundantly described herein.

The zoom-out layout structure of the memory cell array is shown in FIG. 4B. As shown in FIG. 4B, a non-volatile memory comprises plural pages, and each page comprises plural memory cells. In addition, plural p-type well regions PW1~PW5 and plural n-type well regions NW1~NM4 are alternately arranged and formed under the surface of the semiconductor substrate. The memory cells in the first page Page1 are constructed on the n-type well regions NW1, NM2 and the p-type well regions PW1, PW2, PW3. The memory cells in the second page Page2 are constructed on the n-type well regions NW3, NM4 and the p-type well regions PW2, PW4, PW5. That is, the p-type well region PW2 is shared by the two pages.

In comparison with the layout structure of the memory cell array of the first embodiment, each page in the layout structure of the memory cell array of the third embodiment is defined by two n-type well regions and three p-type well regions. Moreover, the p-type well region PW2 is shared by the two pages. Consequently, in the non-volatile memory, the layout structure of the memory cell array of the third embodiment has the smaller layout area.

Figure 5:
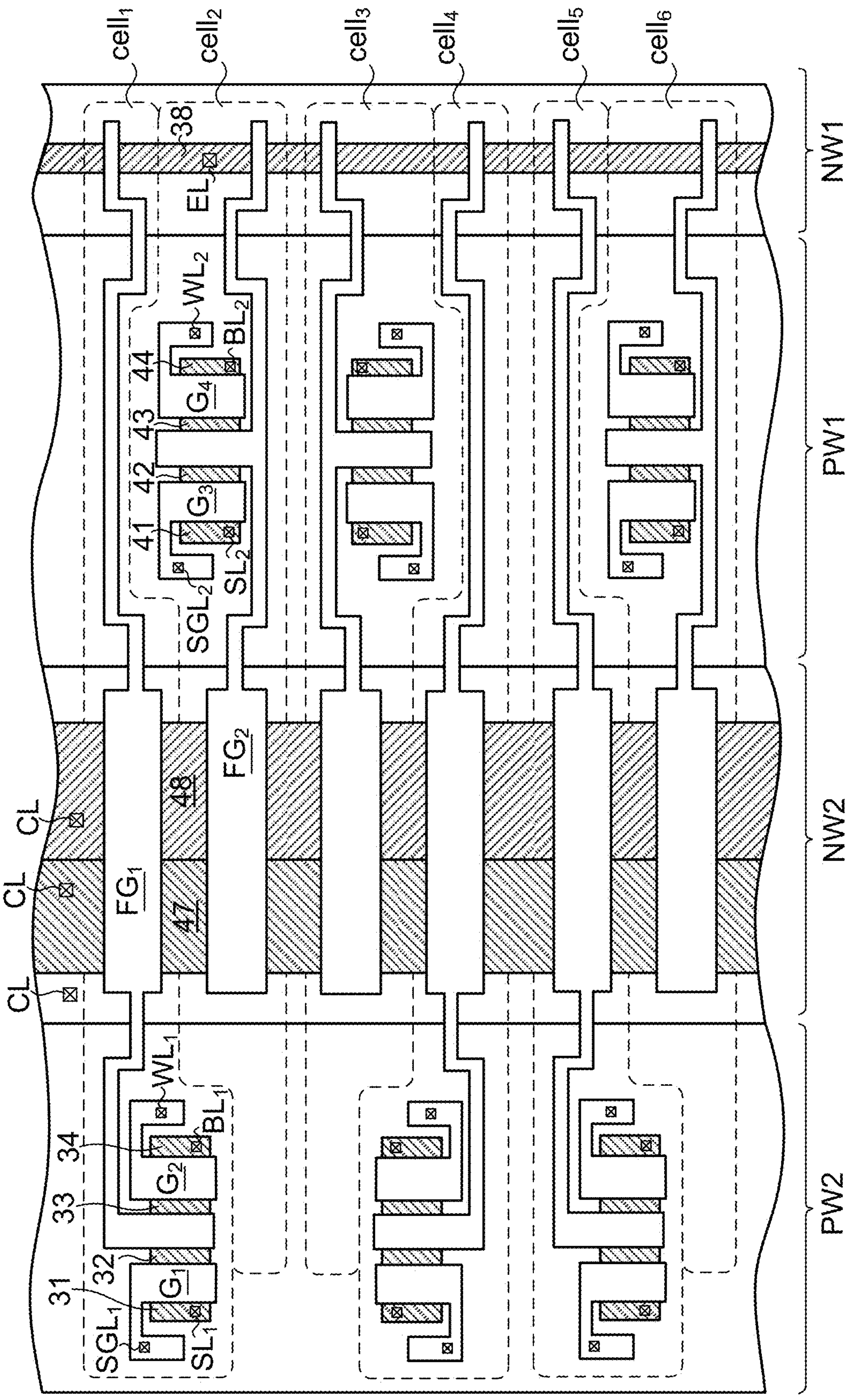
FIG. 5 is a schematic diagram illustrating a variant example of the layout structure of the memory cell array according to the second embodiment.

The layout structure of the second embodiment and the third embodiment may be properly modified. FIG. 5 schematically illustrates a variant example of the layout structure of the memory cell array according to the second embodiment. In comparison with the second embodiment, the floating gates of the memory cells $Cell_2$, $Cell_3$, $Cell_6$ are not extended to the p-type well region PW2. In addition, at least one doped region is formed in the n-type well region NW2. The doped region is connected with the coupling line CL. As shown in FIG. 5, an n-type doped region 47 and a p-type doped region 48 are formed in the n-type well region NW2. The n-type doped region 47 and the p-type doped region 48 are located beside all of the floating gates. A contact terminal is formed on the n-type doped region 47 and connected with the coupling line CL. A contact terminal is formed on the p-type doped region 48 and connected with the coupling line CL. Consequently, a capacitor is formed between the coupling line CL and the floating gate, and the capacitor has a higher coupling ratio. It is noted that the layout structure may be further modified. For example, in another variant example, only a single n-type doped region or a single p-type doped region is formed in the n-type well region NW2.

Figure 6:
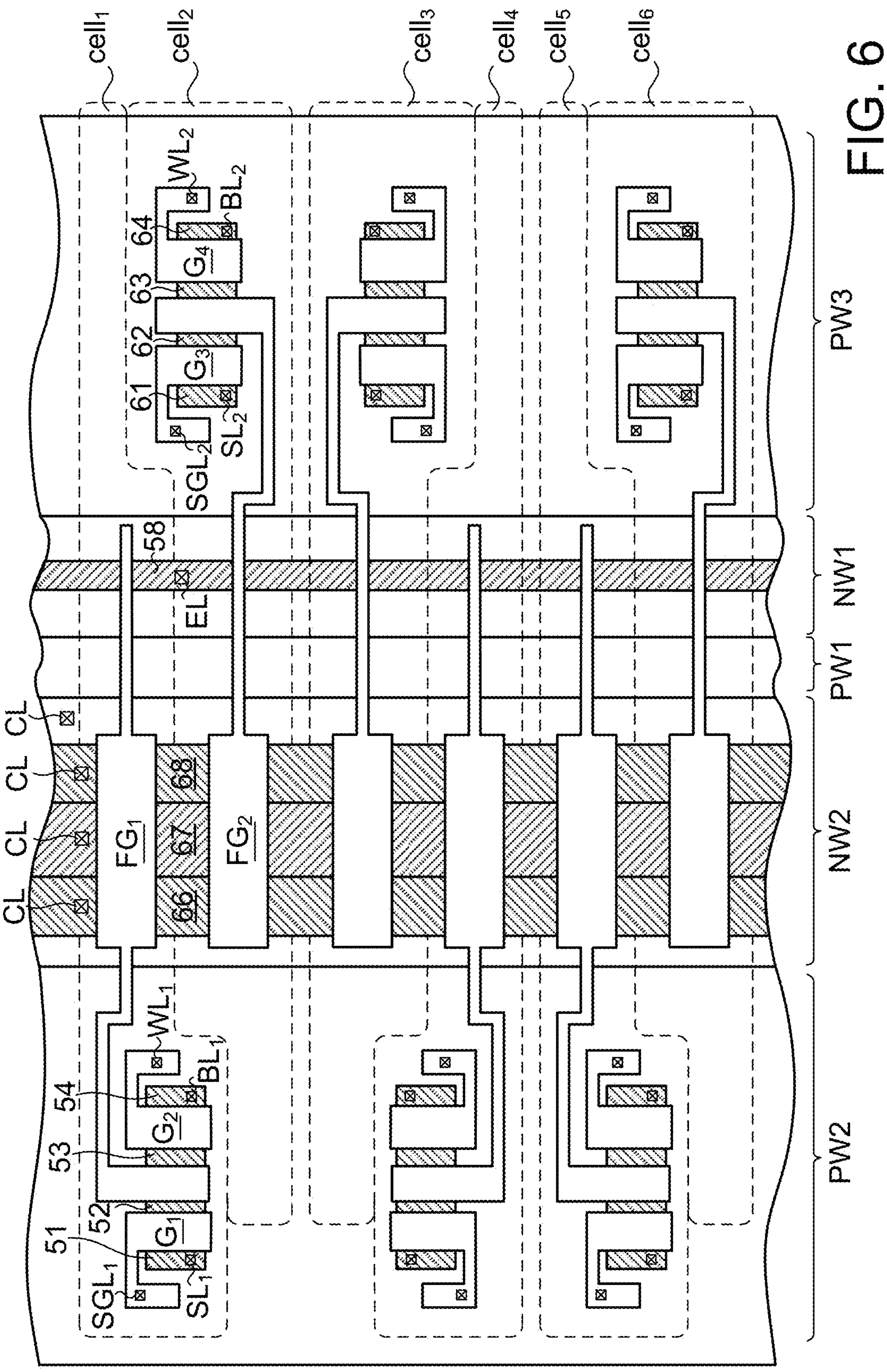
FIG. 6 schematically illustrates a variant example of the layout structure of the memory cell array according to the third embodiment.

FIG. 6 schematically illustrates a variant example of the layout structure of the memory cell array according to the third embodiment. In comparison with the third embodiment, the floating gates of the memory cells $Cell_2$, $Cell_3$, $Cell_6$ are not extended to the p-type well region PW2. Similarly, the floating gate of the memory cells $Cell_1$, $Cell_4$, $Cell_5$ are not extended to the p-type well region PW3. Similarly, at least one doped region is formed in the n-type well region NW2. The doped region is connected with the coupling line CL. As shown in FIG. 6, an n-type doped region 66, a p-type doped region 67 and another n-type doped region 68 are formed in the n-type well region NW2. The n-type doped region 66, the p-type doped region 67 and the n-type doped region 68 are located beside all of the floating gates. A contact terminal is formed on the n-type doped region 66 and connected with the coupling line CL. A contact terminal is formed on the p-type doped region 67 and connected with the coupling line CL. A contact terminal is formed on the n-type doped region 68 and connected with the coupling line CL. Under this circumstance, a capacitor is formed between the coupling line CL and the floating gate, and the capacitor has a higher coupling ratio. It is noted that the layout structure may be further modified. For example, in another variant example, only a single n-type doped region or a single p-type doped region is formed in the n-type well region NW2.

Of course, the layout structure of the memory cell array as shown in FIG. 5 may be further modified. For example, in a variant example, the three doped regions 66, 67 and 68 shown in FIG. 6 are formed in n-type well region NW2. Similarly, the layout structure of the memory cell array as shown in FIG. 6 may be further modified. For example, in a variant example, the two doped regions 47 and 48 shown in FIG. 5 are formed in the n-type well region NW2.

In the second embodiment and the third embodiment, all of the memory cells $Cell_1$~$Cell_6$ are connected with the same coupling line CL and the same erase line EL. It is noted that the connecting relationships between the word lines $WL_1$, $WL_2$, the bit lines $BL_1$, $BL_2$, the source lines $SL_1$, $SL_2$ and the select lines $SGL_1$, $SGL_2$ are not restricted. For example, in an embodiment of the memory cell array, the source lines $SL_1$ and $SL_2$ are connected with each other, the word lines $WL_1$ and $WL_2$ are connected with each other, the select lines $SGL_1$ and $SGL_2$ are connected with each other, and the bit lines $BL_1$ and $BL_2$ are not connected with each other. In another embodiment of the memory cell array, the source lines $SL_1$ and $SL_2$ are connected with each other, the bit lines $BL_1$ and $BL_2$ are connected with each other, the word lines $WL_1$, and $WL_2$ are not connected with each other, and the select lines $SGL_1$ and $SGL_2$ are not connected with each other. In another embodiment of the memory cell array, the connecting relationships between the word lines $WL_1$, $WL_2$, the bit lines $BL_1$, $BL_2$, the source lines $SL_1$, $SL_2$ and the select lines $SGL_1$, $SGL_2$ are distinguished.

In the above embodiments, the memory cell comprises three n-type transistors, a capacitor and a p-type transistor. It is noted that numerous modifications and alterations may be made while retaining the teachings of the invention. For example, in another embodiment, the n-doped region and the p-type doped region are replaced by each other, and the n-type well region and the p-type well region are replaced by each other. Consequently, the modified memory cell comprises three p-type transistors, a capacitor and an n-type transistor.

From the above descriptions, the present invention provides a layout structure of a memory cell array for a non-volatile memory. In the layout structure, plural well regions are formed in the semiconductor substrate, and the shapes of the floating gates are specially designed. Consequently, the layout area of the layout structure of the memory cell array can be effectively reduced.

While the invention has been described in terms of what is presently regarded to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A layout structure of a memory cell array for a non-volatile memory, the layout structure comprising:

a first first-type well region, a second first-type well region, a first second-type well region and a second second-type well region, wherein the second first-type well region is arranged between the first second-type well region and the second second-type well region, and the first second-type well region is arranged between the first first-type well region and the second first-type well region;

a first gate, a second gate and a first floating gate formed on a surface of the second second-type well region, wherein the first floating gate is extended from the second second-type well region to the first first-type well region through the second first-type well region and the first second-type well region;

a first first-type doped region, a second first-type doped region, a third first-type doped region and a fourth first-type doped region formed in the surface of the second second-type well region, wherein the first gate spans a surface between the first first-type doped region and the second first-type doped region, the first floating gate spans a surface between the second first-type doped region and the third first-type doped region, and the second gate spans a surface between the third first-type doped region and the fourth first-type doped region;

a first second-type doped region formed in the first first-type well region, wherein the first second-type doped region is located beside the first floating gate;

a first contact terminal formed on the first second-type doped region and connected with an erase line; and a second contact terminal formed on the second first-type well region and connected with a coupling line.

2. The layout structure as claimed in claim 1, wherein the first floating gate and the second first-type well region are collaboratively formed as a first capacitor, the first floating gate, the first first-type well region, the first second-type doped region are collaboratively formed as a first second-type transistor, the first gate, the first first-type doped region and the second first-type doped region are collaboratively formed as a first select transistor, the first floating gate, the second first-type doped region and the third first-type doped region are collaboratively formed as a first floating gate transistor, the second gate, and the third first-type doped region and the fourth first-type doped region are collaboratively formed as a first switch transistor, wherein the first select transistor, the first floating gate transistor, the first switch transistor, the first capacitor and the first second-type transistor are collaboratively formed as a first memory cell.

3. The layout structure as claimed in claim 1, further comprising:

a third gate, a fourth gate and a second floating gate formed on a surface of the first second-type well region, wherein the second floating gate comprises a first branch and a second branch, wherein the first branch is extended from the first second-type well region to the second first-type well region, the second branch is extended from the first second-type well region to the first first-type well region, and the second branch is located beside the first second-type doped region; and a fifth first-type doped region, a sixth first-type doped region, a seventh first-type doped region and an eighth first-type doped region formed on the surface of the first second-type well region, wherein the third gate spans a surface between the fifth first-type doped region and the sixth first-type doped region, the second floating gate spans a surface between the sixth first-type doped region and the seventh first-type doped region, and the fourth gate spans a surface between the seventh first-type doped region and the eighth first-type doped region.

4. The layout structure as claimed in claim 3, wherein the second floating gate and the second first-type well region are collaboratively formed as a second capacitor, the second floating gate, the first first-type well region, the first second-type doped region are collaboratively formed as a second second-type transistor, the third gate, the fifth first-type doped region and the sixth first-type doped region are collaboratively formed as a second select transistor, the second floating gate, the sixth first-type doped region and the seventh first-type doped region are collaboratively formed as a second floating gate transistor, the fourth gate, and the seventh first-type doped region and the eighth first-type doped region are collaboratively formed as a second switch transistor, wherein the second select transistor, the second floating gate transistor, the second switch transistor, the second capacitor and the second second-type transistor are collaboratively formed as a second memory cell.

5. The layout structure as claimed in claim 3, further comprising:

a ninth first-type doped region formed in the second first-type well region, wherein the ninth first-type doped region is located beside the first floating gate and the second floating gate; and a third contact terminal formed on the ninth first-type doped region and connected with the coupling line.

6. The layout structure as claimed in claim 5, further comprising:

a second second-type doped region formed in the second first-type well region, wherein the second second-type doped region is located beside the first floating gate and the second floating gate; and a fourth contact terminal formed on the second second-type doped region and connected with the coupling line.

7. The layout structure as claimed in claim 6, further comprising:

a tenth first-type doped region formed in the second first-type well region, wherein the tenth first-type doped region is located beside the first floating gate and the second floating gate; and a fifth contact terminal formed on the tenth first-type doped region and connected with the coupling line.

8. The layout structure as claimed in claim 3, further comprising:

a second second-type doped region formed in the second first-type well region, wherein the second second-type doped region is located beside the first floating gate and the second floating gate; and a third contact terminal formed on the second second-type doped region and connected with the coupling line.

9. The layout structure as claimed in claim 1, further comprising:

a third second-type well region, wherein the first first-type well region is arranged between the first second-type well region and the third second-type well region;

a third gate, a fourth gate and a second floating gate formed on a surface of the third second-type well region, wherein the second floating gate is extended from the third second-type well region to the second first-type well region through the first first-type well region and the first second-type well region, and the second floating gate is located beside the first second-type doped region; and a fifth first-type doped region, a sixth first-type doped region, a seventh first-type doped region and an eighth first-type doped region formed on a surface of the third second-type well region, wherein the third gate spans a surface between the fifth first-type doped region and the sixth first-type doped region, the second floating gate spans a surface between the sixth first-type doped region and the seventh first-type doped region, and the fourth gate spans a surface between the seventh first-type doped region and the eighth first-type doped region.

10. The layout structure as claimed in claim 9, wherein the second floating gate and the second first-type well region are collaboratively formed as a second capacitor, the second floating gate, the first first-type well region, the first second-type doped region are collaboratively formed as a second second-type transistor, the third gate, the fifth first-type doped region and sixth first-type doped region are collaboratively formed as a second select transistor, the second floating gate, the sixth first-type doped region and the seventh first-type doped region are collaboratively formed as a second floating gate transistor, and the fourth gate, the seventh first-type doped region and the eighth first-type doped region are collaboratively formed as a second switch transistor, wherein the second select transistor, the second floating gate transistor, the second switch transistor, the second capacitor and the second second-type transistor are collaboratively formed as a second memory cell.

11. The layout structure as claimed in claim 9, further comprising:

a ninth first-type doped region formed in the second first-type well region, wherein the ninth first-type doped region is located beside the first floating gate and the second floating gate; and a third contact terminal formed on the ninth first-type doped region and connected with the coupling line.

12. The layout structure as claimed in claim 11, further comprising:

a second second-type doped region formed in the second first-type well region, wherein the second second-type doped region is located beside the first floating gate and the second floating gate;

a fourth contact terminal formed on the second second-type doped region and connected with the coupling line;

a tenth first-type doped region formed in the second first-type well region, wherein the tenth first-type doped region is located beside the first floating gate and the second floating gate; and a fifth contact terminal formed on the tenth first-type doped region and connected with the coupling line.

13. The layout structure as claimed in claim 9, further comprising:

a second second-type doped region formed in the second first-type well region, wherein the second second-type doped region is located beside the first floating gate and the second floating gate; and a third contact terminal formed on the second second-type doped region and connected with the coupling line.

14. The layout structure as claimed in claim 9, wherein the first floating gate is further extended to the third second-type well region, and the second floating gate is further extended to the second second-type well region.

15. A layout structure of a memory cell array for a non-volatile memory, the layout structure comprising:

a first first-type well region, a second first-type well region, a first second-type well region, a second second-type well region and a third second-type well region, wherein the second first-type well region is arranged between the first second-type well region and the second second-type well region, the first second-type well region is arranged between the first first-type well region and the second first-type well region, and the first first-type well region is arranged between the first second-type well region and the third second-type well region;

a first gate, a second gate and a first floating gate formed on a surface of the third second-type well region, wherein the first floating gate is extended from the third second-type well region to the second first-type well region through the first first-type well region and the first second-type well region;

a first first-type doped region, a second first-type doped region, a third first-type doped region and a fourth first-type doped region formed in a surface of the third second-type well region, wherein the first gate spans a surface between the first first-type doped region and the second first-type doped region, a first floating gate spans a surface between the second first-type doped region and the third first-type doped region, and the second gate spans a surface between the third first-type doped region and the fourth first-type doped region;

a first second-type doped region formed in the first first-type well region, wherein the first second-type doped region is located beside the first floating gate;

a first contact terminal formed on the first second-type doped region and connected with an erase line; and a second contact terminal formed on the second first-type well region and connected with a coupling line.

16. The layout structure as claimed in claim 15, wherein the first floating gate and the second first-type well region are collaboratively formed as a first capacitor, the first floating gate, the first first-type well region, the first second-type doped region are collaboratively formed as a first second-type transistor, the first gate, the first first-type doped region and the second first-type doped region are collaboratively formed as a first select transistor, the first floating gate, the second first-type doped region and the third first-type doped region are collaboratively formed as a first floating gate transistor, and the second gate, the third first-type doped region and the fourth first-type doped region are collaboratively formed as a first switch transistor, wherein the first select transistor, the first floating gate transistor, the first switch transistor, the first capacitor and the first second-type transistor are collaboratively formed as a first memory cell.

17. The layout structure as claimed in claim 15, further comprising:

a fifth first-type doped region formed in the second first-type well region, wherein the fifth first-type doped region is located beside the first floating gate; and a third contact terminal formed on the fifth first-type doped region, wherein the third contact terminal is connected with the coupling line.

18. The layout structure as claimed in claim 17, further comprising:

a second second-type doped region formed in the second first-type well region, wherein the second second-type doped region is located beside the first floating gate;

a fourth contact terminal formed on the second second-type doped region and connected with the coupling line;

a sixth first-type doped region formed in the second first-type well region, wherein the sixth first-type doped region is located beside the first floating gate; and a fifth contact terminal formed on the sixth first-type doped region and connected with the coupling line.

19. The layout structure as claimed in claim 15, further comprising:

a second second-type doped region formed in the second first-type well region, wherein the second second-type doped region is located beside the first floating gate; and a third contact terminal formed on the second second-type doped region and connected with the coupling line.

20. The layout structure as claimed in claim 15, wherein the first floating gate is further extended to the second second-type well region.

* * * * *